United States Patent
McIntyre

(10) Patent No.: US 6,496,526 B1
(45) Date of Patent: Dec. 17, 2002

(54) CURRENT SWITCHING DRIVER WITH CONTROLLED BIAS AND ON STATES

(75) Inventor: Harry J. McIntyre, Los Angeles, CA (US)

(73) Assignee: Xerox Corporation, Stamford, CT (US)

( * ) Notice: Subject to any disclaimer, the term of this patent is extended or adjusted under 35 U.S.C. 154(b) by 147 days.

(21) Appl. No.: 09/692,678

(22) Filed: Oct. 18, 2000

(51) Int. Cl.[7] .................................................. H01S 3/00
(52) U.S. Cl. ................................................... 372/38.02
(58) Field of Search ..................................... 372/38.02

(56) References Cited

U.S. PATENT DOCUMENTS

| | | | | |
|---|---|---|---|---|
| 4,751,524 A | * | 6/1988 | Balchunas | 372/38 |
| 4,799,224 A | * | 1/1989 | Bottacchi et al. | 372/38 |
| 4,819,241 A | * | 4/1989 | Nagano | 372/38 |
| 5,043,992 A | * | 8/1991 | Royer et al. | 372/38 |
| 5,349,595 A | * | 9/1994 | Ogawa et al. | 372/38 |
| 5,438,581 A | * | 8/1995 | Reele | 372/38 |
| 5,512,932 A | * | 4/1996 | Rolfe | 372/38 |
| 5,646,560 A | * | 7/1997 | Nguyen | 372/38 |
| 5,666,045 A | * | 9/1997 | Gordevant | 372/38 |
| 5,675,600 A | * | 10/1997 | Yamamoto et al. | 372/38 |
| 5,966,395 A | * | 10/1999 | Ikeda | 372/38 |
| 5,974,064 A | * | 10/1999 | Uchida | 372/38 |
| 6,028,871 A | * | 2/2000 | Vaughan et al. | 372/38 |

* cited by examiner

Primary Examiner—Leon Scott, Jr.
(74) Attorney, Agent, or Firm—William Propp

(57) ABSTRACT

A laser driver uses a switch, a current mirror, a control transistor and two current generators to control the ON and bias currents in a laser diode. In the bias mode the current from one generator is shared by one half of the current mirror and the adjustable control transistor. The other current generator then drives the other half of the mirror circuit and the laser diode in parallel, resulting in the laser diode getting the same amount of current that the control transistor gets. In the ON mode, the switch cuts off the first half of the current mirror, which is mirrored in the other half, so that all of the other generator current is used in the laser diode. The current drivers are adjustable to the ON current and the control transistor current is adjustable to the bias current.

3 Claims, 2 Drawing Sheets

CURRENT SWITCHING DRIVER WITH CONTROLLED BIAS AND ON STATES

BACKGROUND OF THE INVENTION

A laser diode driver circuit is implemented from two current drivers, a switching circuit, a mirror circuit and one transistor which adjustably sets the ON and OFF bias currents for the laser diode.

A laser diode driver must be adjustable to drive a diode with a low current bias level when the diode is OFF, and a high current level when it is ON. The circuit must be able to handle enough current when driven by a low voltage power supply, and have few components. Operational amplifiers with surrounding circuits are sometimes used but it is difficult to get a single amplifier to output two adjustable current levels. An improved circuit is needed.

SUMMARY OF THE INVENTION

The circuit contains two current drivers which generate equal currents which are adjustable to the ON current of the diode. In the ON mode, all of the current from one of the drivers is forced by a control transistor to go through the diode. In the bias (OFF) mode a slight amount of adjustable current from the same control transistor is used determine how much current goes to the diode. Thus, a single control transistor can be used to control the two current levels, by turning the control transistor fully OFF in one case and making the transistor adjustable to the bias current in the other.

DETAILED DESCRIPTION OF THE INVENTION

Figure 1:
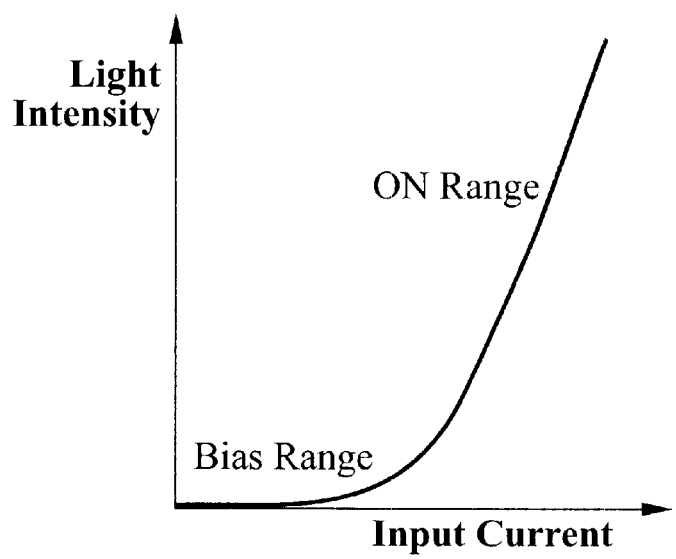
FIG. 1 is a graph of light intensity versus input current for a laser diode.

FIG. 1 is a graph showing a typical plot of diode-generated light intensity against diode input current. In a typical digital system, the diode is either generating light at fill intensity or essentially zero light at some small bias input current, and each input current level must be independently adjustable.

Figure 2:
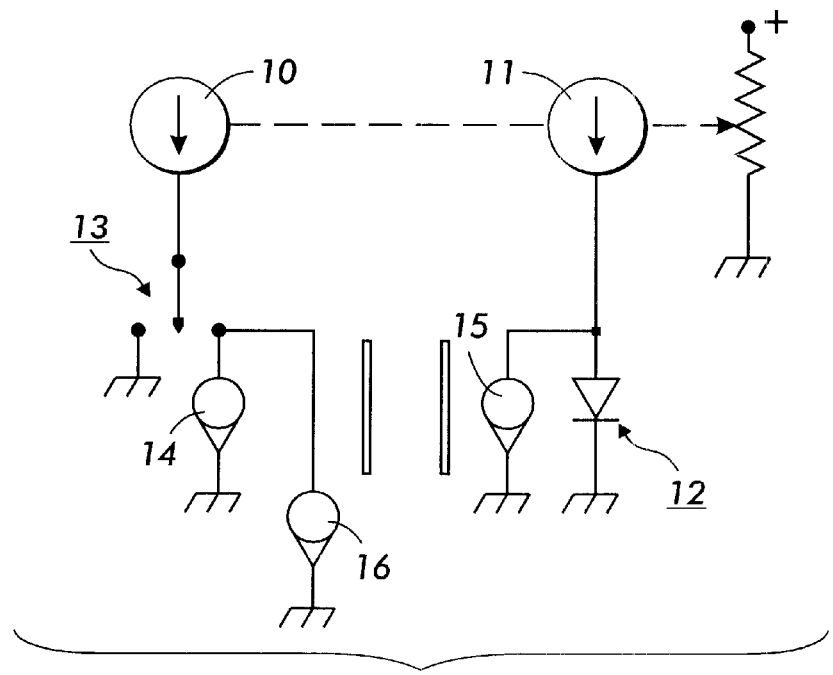
FIG. 2 is a functional diagram of a laser driver with two adjustable current generators to control the ON and bias current of the preferred embodiment.

FIG. 2 is a functional diagram of the circuit of a laser driver of the preferred embodiment of the present invention. Two current generators 10, 11, each are adjustable to produce the proper amount of ON current to drive the laser diode 12.

In the laser OFF, or bias, mode, the switch 13 is thrown to the right, diverting all of the current of generator 10 through the right half of the current mirror. Mirror transistors 14, 15 are two parts of a current mirror so that whatever current is in the left half 14 will guarantee the same amount of current in the right half 15. Thus, the right half of the current mirror would conduct all of the current of generator 11 to ground except that adjustable control transistor 16 conducts exactly as much current as there should be current through the diode in the OFF bias mode. Since this amount of current is subtracted from left half 14, then right half 15 will also be conducting slightly less than all of the output of current driver 11, the remainder going through the diode 12 as bias current.

In the ON mode, switch 13 is thrown to the left, no current is possible in the left half of the mirror, and therefore in the right half of the mirror as well, and all of the current from generator 11 goes through the diode 12.

Thus it can be seen that the ON voltage is adjusted at the current generators 10, 11, and the bias current is adjusted at control transistor 16.

Figure 3:
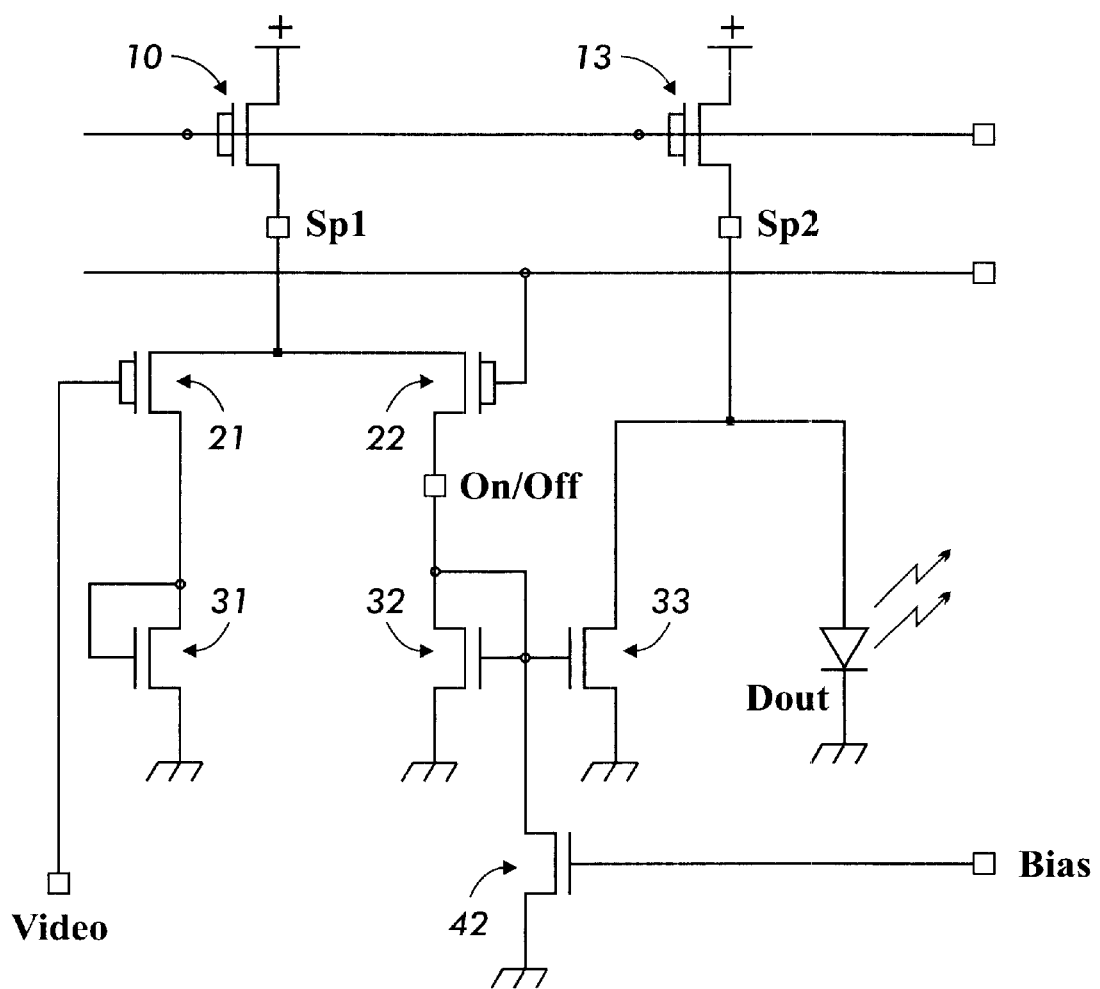
FIG. 3 is a schematic circuit diagram of the laser driver of FIG. 2.

FIG. 3 is a schematic circuit diagram of the preferred embodiment of the invention. Transistors 10 and 13 are biased by any commonly known bias circuitry and deliver equal currents to nodes Sp1 and Sp2. Transistors 21 and 22 are a source pair that switch the current through Sp1 between loads 31 and 32. Assume that the video input is always high (5 volts) to indicate that the circuit is in an operational mode, so that transistor 31 is always ON.

In the user adjustable ON current mode, when the input, strobe, is low (0 volts) transistor 21 is ON and the current through Sp1 goes entirely through transistor 21. At the same time, transistor 22 is cut off, allowing no current to pass the On/Off node. This leaves no specific voltage determining the state of current mirror transistors 32, 33. That is, neither ON nor OFF. Now, the ON/OFF node is pulled to zero by control transistor 42. Transistors 32, 33, conduct no current, and all the current from user adjustable current generator 13 is delivered to the diode Dout.

In the Bias mode, when the input Strobe is high (5 volts) transistor 21 is OFF and the current through Sp1 goes entirely through transistor 22 and the ON/OFF node. However, some of the current is lost to control transistor 42 while the remainder is mirrored from transistor 32 to transistor 33. As the difference between the current through Sp2 and the current mirrored to transistor 33 is the small amount bled off by control transistor 42, this small amount is the current that drives the laser diode. This small current is set by the bias input of transistor 42 to determine the bias setting of FIG. 1.

Thus, it can be seen that transistor 42 has two functions, it shuts off current mirror 32, 33 in the ON state and sets the amount of current in the bias state.

While the invention has been described with reference to a specific embodiment, it will be understood by those skilled in the art that various changes may be made and equivalents may be substituted for elements thereof without departing from the true spirit and scope of the invention. In addition, many modifications may be made without departing from the essential teachings of the invention.

What is claimed is:

1. A laser driver circuit comprising:

first and second current generators for producing an amount of current equal to that required to drive a laser diode at its ON current, a current mirror comprising a first and second sections, the first current generator is electrically connected to the first section of the current mirror, the second current generator is electrically connected to the second section of the current mirror, a switch for opening or closing a connection between the first current generator and the first section of the current mirror, when the switch closes the connection between the first current generator and the first section of the current mirror, current from the first current generator is conducted to the first section of the current mirror wherein the second section of the current mirror conducts an equal current from the second current generator to ground with the remainder of the current from the second current generator is conducted to the laser diode, when the switch opens the connection between the first current generator and the first section of the current mirror, current from the first current generator is conducted to ground wherein the current from the second current generator is conducted to the laser diode, a control means for conducting a bias amount of current from the first current generator when the switch is closed, and a laser diode is electrically connected in series with the second current generator and is electrically connected in parallel with the second section of the current mirror.

2. The circuit of claim 1 wherein the control means, each current generator and each current mirror section is implemented from one transistor and wherein the switch is implemented from two transistors arranged so that only one is conducting at a time.

3. The circuit of claim 1 wherein the current generated by the current generators is adjustable and the control means adjusts the current from the first current generator when the switch is closed.

* * * * *